United States Patent
Khlat

(10) Patent No.: US 12,249,961 B2
(45) Date of Patent: Mar. 11, 2025

(54) WIDE BANDWIDTH POWER AMPLIFIER APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 626 days.

(21) Appl. No.: 17/668,458

(22) Filed: Feb. 10, 2022

(65) Prior Publication Data
US 2023/0253922 A1    Aug. 10, 2023

(51) Int. Cl.
H03F 1/02    (2006.01)
H03F 3/189    (2006.01)
H03F 3/20    (2006.01)

(52) U.S. Cl.
CPC .............. *H03F 1/02* (2013.01); *H03F 3/189* (2013.01); *H03F 3/20* (2013.01); *H03F 2200/102* (2013.01); *H03F 2200/451* (2013.01)

(58) Field of Classification Search
CPC ... H03F 1/02; H03F 3/189; H03F 3/20; H03F 2200/102; H03F 2200/451; H03F 2200/36; H03F 1/0266; H03F 1/42; H03F 3/19; H03F 1/0227; H03F 3/245
USPC ................................................. 330/127, 136
See application file for complete search history.

(56) References Cited

U.S. PATENT DOCUMENTS

2018/0076772 A1* 3/2018 Khesbak .............. H03G 1/0029

FOREIGN PATENT DOCUMENTS

WO    2021034878 A1    2/2021

* cited by examiner

*Primary Examiner* — Andrea Lindgren Baltzell
*Assistant Examiner* — Khiem D Nguyen
(74) *Attorney, Agent, or Firm* — Withrow & Terranova, P.L.L.C.

(57) ABSTRACT

A wide bandwidth power amplifier apparatus is provided. The wide bandwidth power amplifier apparatus includes a power amplifier circuit, a primary switcher circuit, a voltage circuit(s), and an auxiliary switcher circuit(s). The power amplifier circuit is configured to amplify a radio frequency (RF) signal based on a modulated voltage and a modulated current. The voltage circuit is configured to generate the modulated voltage and a respective part of the modulated current. The primary switcher circuit and the auxiliary switcher circuit are each configured to also generate a respective part of the modulated current. The auxiliary switcher circuit only generates the respective part of the modulated current when a bandwidth of the modulated voltage exceeds a bandwidth threshold. As such, it is possible to prevent the voltage circuit from having to source additional current when the modulated voltage exceeds the bandwidth threshold, thus helping to improve efficiency of the voltage circuit.

20 Claims, 3 Drawing Sheets

WIDE BANDWIDTH POWER AMPLIFIER APPARATUS

FIELD OF THE DISCLOSURE

The technology of the disclosure relates generally to a radio frequency (RF) power amplifier circuit.

Background

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation new radio (5G-NR) wireless communication technology has been widely regarded as the next wireless communication standard beyond the current third-generation (3G) communication standard, such as wideband code division multiple access (WCDMA), and the fourth-generation (4G) communication standard, such as Long-Term Evolution (LTE). As such, a 5G-NR capable mobile communication device is expected to achieve significantly higher data rates, improved coverage range, enhanced signaling efficiency, and reduced latency compared with a conventional mobile communication device supporting only the 3G and 4G communication standards.

The 5G-NR capable mobile communication device can be configured to transmit a radio frequency (RF) signal(s) in a millimeter wave (mmWave) RF spectrum. Notably, RF signals transmitted in the mmWave RF spectrum are more susceptible to propagation attenuation and interference. In this regard, the 5G-NR capable mobile communication device typically employs a power amplifier circuit(s) to help improve signal-to-noise ratio (SNR) and/or signal-to-interference-plus-noise ratio (SINR) of the RF signal(s). Envelope tracking (ET) is a power management technique designed to improve operating efficiency of the power amplifier(s) to help reduce power consumption and thermal dissipation. More specifically, the power amplifier(s) is configured to amplify the RF signal(s) based on an ET voltage that rises and falls in accordance with an amplitude of the RF signal(s). Understandably, the better the ET voltage tracks the amplitude of the RF signal(s), the higher the efficiency can be achieved in the power amplifier(s). In this regard, it may be desirable to generate the ET voltage in accordance with modulation bandwidth and/or peak-to-average ratio (PAR) of the RF signal(s).

SUMMARY

Embodiments of the disclosure relate to a wide bandwidth power amplifier apparatus. The wide bandwidth power amplifier apparatus includes a power amplifier circuit, a primary switcher circuit, a voltage circuit(s), and an auxiliary switcher circuit(s). The power amplifier circuit is configured to amplify a radio frequency (RF) signal to time-variant power levels based on a modulated voltage and a modulated current. The voltage circuit is configured to generate the modulated voltage and a respective part of the modulated current. The primary switcher circuit and the auxiliary switcher circuit are each configured to also generate a respective part of the modulated current. In an embodiment, the auxiliary switcher circuit is controlled to only generate the respective part of the modulated current when a bandwidth of the modulated voltage exceeds a bandwidth threshold. As such, it is possible to prevent the voltage circuit from having to source additional current when the modulated voltage exceeds the bandwidth threshold, thus helping to improve efficiency of the voltage circuit.

In one aspect, a wide bandwidth power amplifier apparatus is provided. The wide bandwidth power amplifier apparatus includes a power amplifier circuit. The power amplifier circuit is configured to amplify an RF signal based on a modulated voltage and a modulated current. The wide bandwidth power amplifier apparatus also includes an envelope tracking (ET) integrated circuit (ETIC). The ETIC includes a voltage circuit. The voltage circuit is coupled to the power amplifier circuit and configured to generate the modulated voltage and a high-frequency current as part of the modulated current. The ETIC also includes a primary switcher circuit. The primary switcher circuit is coupled to the power amplifier circuit and configured to generate a low-frequency current as part of the modulated current. The ETIC also includes an auxiliary switcher circuit. The auxiliary switcher circuit is configured to generate an auxiliary current. The ETIC also includes a control circuit. The control circuit is configured to cause the auxiliary switcher circuit to provide the auxiliary current to the power amplifier circuit as part of the modulated current when a bandwidth of the modulated voltage is higher than or equal to a bandwidth threshold. The control circuit is also configured to cause the auxiliary switcher circuit not to provide the auxiliary current to the power amplifier circuit when the bandwidth of the modulated voltage is lower than the bandwidth threshold.

In another aspect, a wide bandwidth power amplifier apparatus is provided. The wide bandwidth power amplifier apparatus includes a power amplifier circuit. The power amplifier circuit is configured to amplify an RF signal based on a modulated voltage and a modulated current. The wide bandwidth power amplifier apparatus also includes an ETIC. The ETIC includes a primary switcher circuit. The primary switcher circuit is coupled to the power amplifier circuit and configured to generate a low-frequency current as part of the modulated current. The wide bandwidth power amplifier apparatus also includes a distributed ETIC (DETIC). The DETIC includes a voltage circuit. The voltage circuit is coupled to the power amplifier circuit and configured to generate the modulated voltage and a high-frequency current as part of the modulated current. The DETIC also includes an auxiliary switcher circuit. The auxiliary switcher circuit is configured to generate an auxiliary current. The DETIC also includes a control circuit. The control circuit is configured to cause the auxiliary switcher circuit to provide the auxiliary current to the power amplifier circuit as part of the modulated current when a bandwidth of the modulated voltage is higher than or equal to a bandwidth threshold. The control circuit is also configured to cause the auxiliary switcher circuit not to provide the auxiliary current to the power amplifier circuit when the bandwidth of the modulated voltage is lower than the bandwidth threshold.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
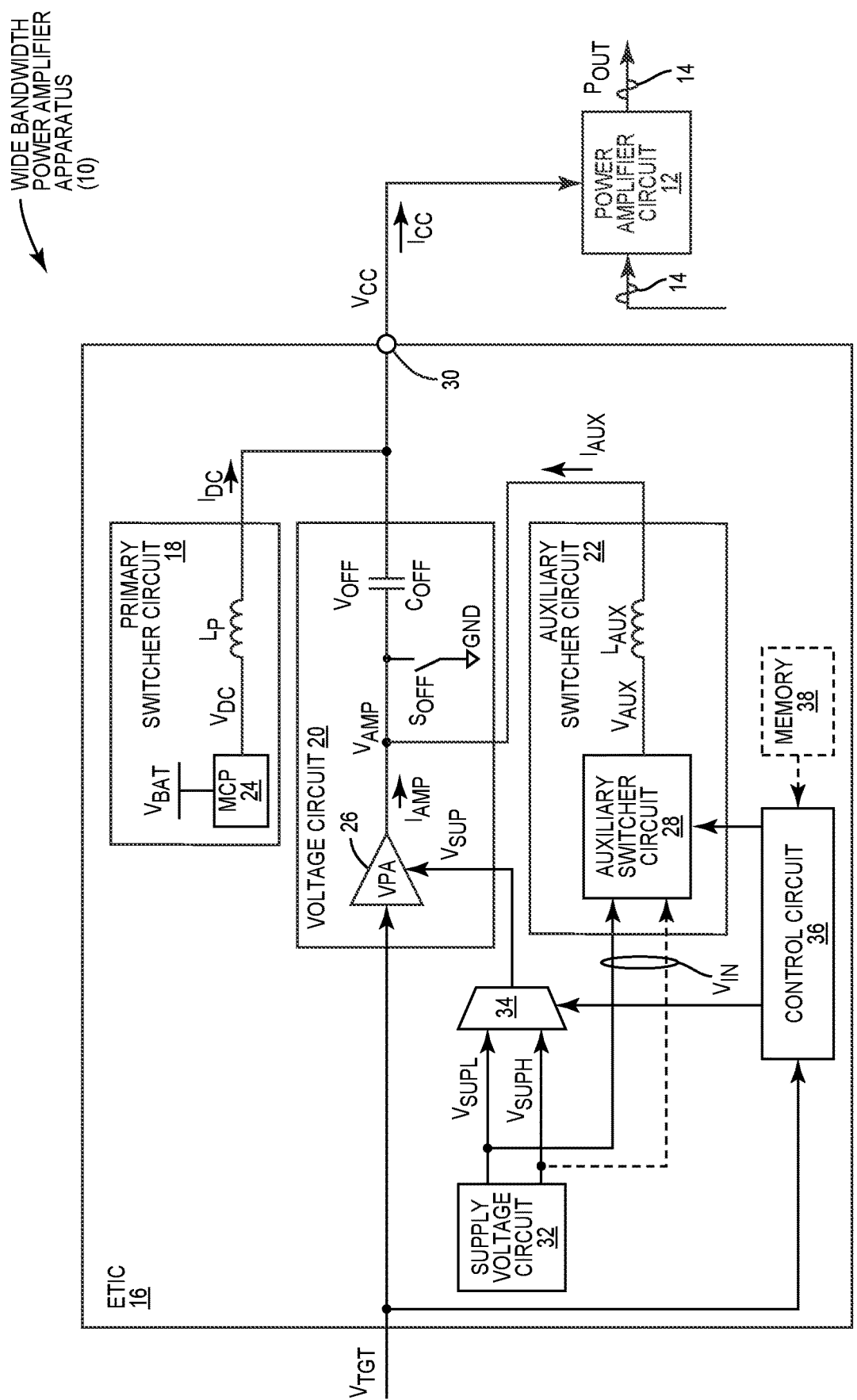
FIG. 1 is a schematic diagram of an exemplary wide bandwidth power amplifier apparatus configured according to an embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a wide bandwidth power amplifier apparatus. The wide bandwidth power amplifier apparatus includes a power amplifier circuit, a primary switcher circuit, a voltage circuit(s), and an auxiliary switcher circuit(s). The power amplifier circuit is configured to amplify a radio frequency (RF) signal to time-variant power levels based on a modulated voltage and a modulated current. The voltage circuit is configured to generate the modulated voltage and a respective part of the modulated current. The primary switcher circuit and the auxiliary switcher circuit are each configured to also generate a respective part of the modulated current. In an embodiment, the auxiliary switcher circuit is controlled to only generate the respective part of the modulated current when a bandwidth of the modulated voltage exceeds a bandwidth threshold. As such, it is possible to prevent the voltage circuit from having to source additional current when the modulated voltage exceeds the bandwidth threshold, thus helping to improve efficiency of the voltage circuit.

FIG. 1 is a schematic diagram of an exemplary wide bandwidth power amplifier apparatus 10 configured according to an embodiment of the present disclosure. The wide bandwidth power amplifier apparatus 10 includes a power amplifier circuit 12, which can be any type of power amplifier circuit including but not limited to a differential power amplifier circuit, a quadrature power amplifier circuit, and so on. The power amplifier circuit 12 is configured to amplify an RF signal 14 to a time-variant power $P_{OUT}$ based on a modulated voltage $V_{CC}$ and a modulated current $I_{CC}$ ($P_{OUT}=V_{CC}\times I_{CC}$). Understandably, the RF signal 14 may be modulated across a wide range of bandwidth (e.g., 320 MHz or above) and/or associated with a large peak-to-average ratio (PAR) depending on a type of wireless communications system and/or an RF spectrum in which the RF signal 14 is transmitted. In this regard, the modulated voltage $V_{CC}$ and/or the modulated current $I_{CC}$ must rise and fall in accordance with the time-variant power $P_{OUT}$ to prevent distortions (e.g., amplitude clipping) in the RF signal 14 and/or maintain higher operating efficiency at the power amplifier circuit 12.

The wide bandwidth power amplifier apparatus 10 includes an envelope tracking (ET) integrated circuit (ETIC) 16. The ETIC 16 is coupled to the power amplifier circuit 12 and configured to provide the modulated voltage $V_{CC}$ and the modulated current $I_{CC}$ to the power amplifier circuit 12. In an embodiment, the ETIC 16 includes a primary switcher circuit 18, a voltage circuit 20, and an auxiliary switcher circuit 22. The primary switcher circuit 18 is configured to generate a low-frequency current $I_{DC}$ (e.g., a constant or an average current) as part of the modulated current $I_{CC}$. The voltage circuit 20 is configured to generate the modulated voltage $V_{CC}$ based on a modulated target voltage $V_{TGT}$ and a supply voltage $V_{SUP}$. In a non-limiting example, the modulated target voltage $V_{TGT}$ is provided by a transceiver circuit (not shown) that also generates the RF signal 14. In addition, the voltage circuit 20 may also generate a high-frequency current $I_{AMP}$ (e.g., an alternating current) as another part of the modulated current $I_{CC}$. The auxiliary switcher circuit 22 is configured to generate an auxiliary current $I_{AUX}$.

As described below, the auxiliary current $I_{AUX}$ may be included as part of the modulated current $I_{CC}$ when a bandwidth of the modulated voltage $V_{CC}$ is higher than or equal to a bandwidth threshold (e.g., 200 MHz). In this regard, the modulated current $I_{CC}$ will include the low-frequency current $I_{CC}$, the high-frequency current $I_{AMP}$, and the auxiliary current $I_{AUX}$ ($I_{CC}=I_{CC}+I_{AMP}+I_{AUX}$). In contrast, when the bandwidth of the modulated voltage $V_{CC}$ is lower than the bandwidth threshold, the auxiliary current $I_{AUX}$ will not be included as part of the modulated current $I_{CC}$. As a result, the modulated current $I_{CC}$ will only include the low-frequency current $I_{CC}$ and the high-frequency current $I_{AMP}$ ($I_{CC}=I_{CC}+I_{AMP}$). By supplementing the modulated current $I_{CC}$ with the auxiliary current $I_{AUX}$, it is possible to prevent the voltage circuit 20 from having to source additional current when the modulated voltage $V_{CC}$ exceeds the bandwidth threshold, thus helping to improve efficiency of the voltage circuit 20.

Notably, the primary switcher circuit 18, the voltage circuit 20, and/or the auxiliary switcher circuit 22 are illustrated in FIG. 1 merely as non-limiting examples. It should be appreciated that the ETIC 16 can be configured to include an additional primary switcher circuit, voltage circuit, and/or auxiliary switcher circuit to provide additional low-frequency current, high-frequency current, and/or auxiliary current as needed.

The primary switcher circuit 18 includes a multi-level charge pump (MCP) 24, which can be a direct-current (DC) to DC (DC-DC) buck-boost converter, as an example. The MCP 24 is configured to generate a low-frequency voltage $V_{DC}$ (e.g., a constant or average voltage) as a function of a battery voltage $V_{BAT}$. In an embodiment, the MCP 24 may operate in a buck mode to generate the low-frequency voltage $V_{DC}$ at $0 \times V_{BAT}$ or $1 \times V_{BAT}$, or in a boost mode to generate the low-frequency voltage $V_{DC}$ at $2 \times V_{BAT}$. Thus, by configuring the MCP 24 to alternate between $0 \times V_{BAT}$, $1 \times V_{BAT}$, and/or $2 \times V_{BAT}$ in accordance with a duty cycle (e.g., 30%@$0 \times V_{BAT}$, 30%@$1 \times V_{BAT}$, and 40%@$2 \times V_{BAT}$), the MCP 24 will be able to generate the low-frequency voltage $V_{DC}$ at any desired levels. The primary switcher circuit 18 also includes a primary power inductor $L_P$, which is configured to induce the low-frequency $I_{CC}$ based on the low-frequency voltage $V_{DC}$.

The voltage circuit 20 includes a voltage amplifier 26 (denoted as "VPA"). The voltage amplifier 26 is configured to generate an initial modulated voltage $V_{AMP}$ and the high-frequency current $I_{AMP}$ based on the modulated target voltage $V_{TGT}$ and the supply voltage $V_{SUP}$. The voltage circuit 20 also includes an offset capacitor $C_{OFF}$ that is coupled in series to the voltage amplifier 26. The offset capacitor $C_{OFF}$ is configured to raise the initial modulated voltage $V_{AMP}$ by an offset voltage $V_{OFF}$ to generate the modulated voltage $V_{CC}$ ($V_{CC}=V_{AMP}+V_{OFF}$). Notably, using the offset capacitor $C_{OFF}$ to raise the initial modulated voltage $V_{AMP}$, the voltage amplifier 26 can generate the initial modulated voltage $V_{AMP}$ at a relatively lower level compared to an actual level of the modulated voltage $V_{CC}$. As a result, an output stage in the voltage amplifier 26 (not shown) can be implemented with smaller transistors and driven by a lower supply voltage, thus helping the voltage amplifier 26 to achieve an improved operating efficiency.

In an embodiment, the offset voltage $V_{OFF}$ can be modulated across the offset capacitor $C_{OFF}$ based on the low-frequency current $I_{DC}$. In this regard, an offset switch $S_{OFF}$ may be provided in between the voltage amplifier 26 and the offset capacitor $C_{OFF}$. When the offset switch $S_{OFF}$ is closed, the low-frequency current $I_{DC}$ will flow from the primary switcher circuit 18 to a ground (GND) through the offset capacitor $C_{OFF}$ to thereby charge the offset capacitor $C_{OFF}$. The offset switch $S_{OFF}$ will be opened when the offset capacitor $C_{OFF}$ is charged to the offset voltage $V_{OFF}$ at a desired level (e.g., 0.8 V).

The auxiliary switcher circuit 22 includes an auxiliary voltage circuit 28 and an auxiliary power inductor $L_{AUX}$, which may have a lower inductance than the primary power inductor $L_P$. In an embodiment, the auxiliary voltage circuit 28 is configured to output an auxiliary voltage $V_{AUX}$ as a function of an auxiliary input voltage $V_{IN}$. The auxiliary power inductor $L_{AUX}$ is configured to induce the auxiliary current $I_{AUX}$ based on the auxiliary voltage $V_{AUX}$.

In an embodiment, the auxiliary power inductor $L_{AUX}$ is coupled to an output of the voltage amplifier 26, and the primary power inductor $L_P$ and the offset capacitor $C_{OFF}$ are coupled to a voltage output 30, which is coupled to the power amplifier circuit 12. Accordingly, the power amplifier circuit 12 can receive the modulated voltage $V_{CC}$ and the modulated current $I_{CC}$ via the voltage output 30. In this regard, the voltage output 30 will also act as a summing node for the low-frequency current $I_{DC}$, the high-frequency current $I_{AMP}$, and the auxiliary current $I_{AUX}$.

The ETIC 16 includes a supply voltage circuit 32, which can be a capacitor-based buck-boost DC-DC converter, as an example. The supply voltage circuit 32 is configured to generate at least a first supply voltage $V_{SUPL}$ and a second supply voltage $V_{SUPH}$ ($V_{SUPH}>V_{SUPL}$). In an embodiment, the supply voltage circuit 32 may be configured to selectively output the first supply voltage $V_{SUPL}$ and the second supply voltage $V_{SUPH}$ to the voltage amplifier 26 as the supply voltage $V_{SUP}$ via an output circuit 34.

The ETIC 16 is further configured to include a control circuit 36, which can be a field-programmable gate array (FPGA), as an example. The control circuit 36 is configured to monitor the bandwidth of the modulated voltage $V_{CC}$ to determine whether the bandwidth of the modulated voltage $V_{CC}$ exceeds the bandwidth threshold. In one embodiment, the control circuit 36 may determine the bandwidth of the modulated voltage $V_{CC}$ dynamically based on the modulated voltage $V_{TGT}$. In another embodiment, the control circuit 36 may determine the bandwidth of the modulated voltage $V_{CC}$ statically based on a configuration prestored in a memory circuit 38. When the control circuit 36 determines that the bandwidth of the modulated voltage $V_{CC}$ exceeds ($\geq$) the bandwidth threshold, the control circuit 36 can cause the auxiliary switcher circuit 22 to provide the auxiliary current $I_{AUX}$ to the power amplifier circuit 12 as part of the modulated current $I_{CC}$. In contrast, when the control circuit 36 determines that the bandwidth of the modulated voltage $V_{CC}$ is below (<) the bandwidth threshold, the control circuit 36 then causes the auxiliary switcher circuit 22 not to provide the auxiliary current $I_{AUX}$ to the power amplifier circuit 12.

The control circuit 36 may also monitor a PAR of the RF signal 14. In a non-limiting example, the PAR of the RF signal 14 can also be prestored in the memory circuit 38. When the PAR is above a predefined power threshold, the control circuit 36 can control the output circuit 34 to provide the first supply voltage $V_{SUPH}$ to the voltage amplifier 26 as the supply voltage $V_{SUP}$ such that the voltage amplifier 26 can generate the initial modulated voltage $V_{AMP}$ at a sufficient level to prevent potential distortion in the modulated voltage $V_{CC}$. In contrast, when the PAR is below the predefined power threshold, the control circuit 36 can control the output circuit 34 to provide the second supply voltage $V_{SUPL}$ to the voltage amplifier 26 as the supply voltage $V_{SUP}$ such that the voltage amplifier 26 can operate with higher efficiency.

In an embodiment, the auxiliary voltage circuit 28 can receive the second supply voltage $V_{SUPL}$ regardless of the PAR of the RF signal 14. In this regard, as will be further illustrated in FIG. 3, the auxiliary voltage circuit 28 will generate the auxiliary voltage $V_{AUX}$ that equals 0 V or the second supply voltage $V_{SUPL}$.

In another embodiment, the control circuit 36 can cause the first supply voltage $V_{SUPH}$ to be concurrently provided to the voltage amplifier 26 and the auxiliary voltage circuit 28 when the control circuit 36 determines that the PAR of the RF signal 14 is above the power threshold. In this regard, as will be further illustrated in FIG. 3, the auxiliary voltage circuit 28 will generate the auxiliary voltage $V_{AUX}$ that equals 0 V or the first supply voltage $V_{SUPH}$.

In another embodiment, the control circuit 36 can cause the second supply voltage $V_{SUPL}$ to be concurrently provided to the voltage amplifier 26 and the auxiliary voltage circuit 28 when the control circuit 36 determines that the PAR of the RF signal 14 is below the power threshold. In this regard, as will be further illustrated in FIG. 3, the auxiliary voltage circuit 28 will generate the auxiliary voltage $V_{AUX}$ that equals 0 V or the second supply voltage $V_{SUPL}$.

Figure 2:
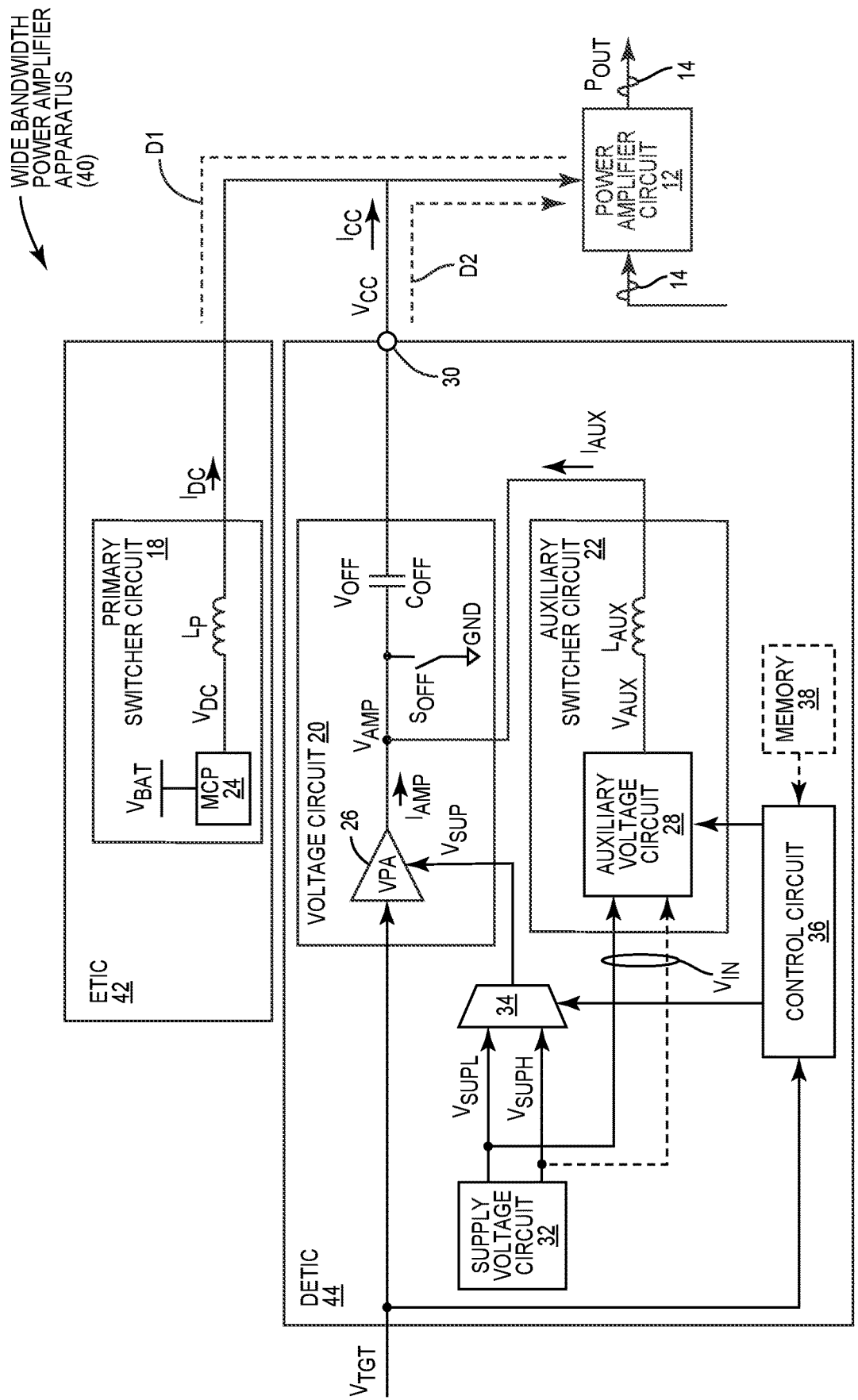
FIG. 2 is a schematic diagram of an exemplary wide bandwidth power amplifier apparatus configured according to another embodiment of the present disclosure.

Alternative to integrating the primary switcher circuit 18, the voltage circuit 20, and the auxiliary switcher circuit 22 into the ETIC 16, it is also possible to provide the primary switcher circuit 18, the voltage circuit 20, and the auxiliary switcher circuit 22 in different dies. In this regard, FIG. 2 is a schematic diagram of an exemplary wide bandwidth power amplifier apparatus 40 configured according to another embodiment of the present disclosure. Common elements between FIGS. 1 and 2 are shown therein with common element numbers and will not be re-described herein.

In this embodiment, the wide bandwidth power amplifier apparatus 40 includes an ETIC 42 and a distributed ETIC (DETIC) 44, which are provided in different dies. Herein, the ETIC 42 is configured to include the primary switcher circuit 18, while the DETIC 44 is configured to include the voltage circuit 20, the auxiliary switcher circuit 22, the supply voltage circuit 32, and the control circuit 36.

The ETIC 42 is coupled to the power amplifier circuit 12 via a first coupling distance $D_1$, and the DETIC 44 is coupled to the power amplifier circuit 12 via a second coupling distance $D_2$ that is shorter than the first coupling distance $D_1$. By providing the DETIC 44 closer to the power amplifier circuit 12, it is possible to reduce distortions (e.g., voltage ripple) in the modulated voltage $V_{CC}$ as a result of, for example, trace inductance associated with a coupling path.

Figure 3:
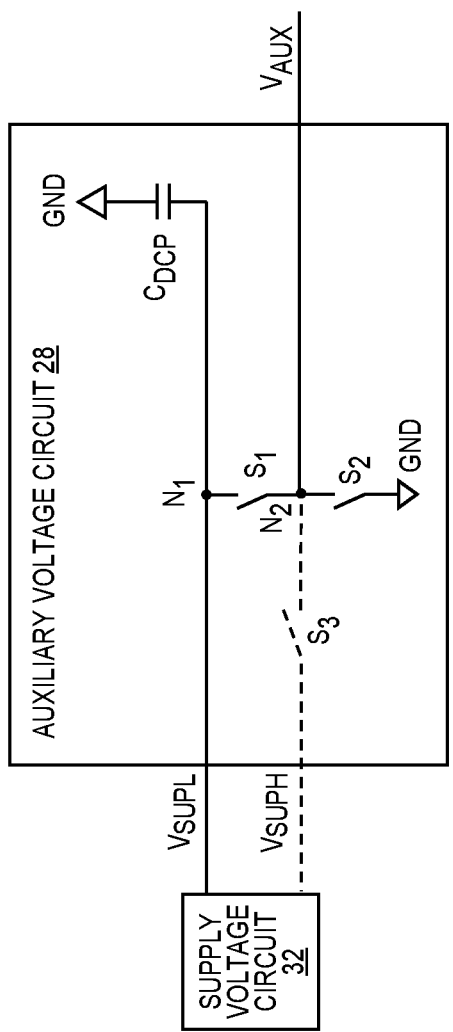
FIG. 3 is a schematic diagram of an exemplary auxiliary switcher circuit that can be provided in the wide bandwidth power amplifier apparatuses of FIGS. 1 and 2.

FIG. 3 is a schematic diagram providing an exemplary illustration of the auxiliary voltage circuit 28 in the wide bandwidth power amplifier apparatus 10 of FIG. 1 and the wide bandwidth power amplifier apparatus 40 of FIG. 2. Common elements between FIGS. 1, 2, and 3 are shown therein with common element numbers and will not be re-described herein.

In an embodiment, the auxiliary voltage circuit 28 includes a first switch $S_1$ and a second switch $S_2$ and may optionally include a third switch $S_3$. The first switch $S_1$ is coupled between a first coupling node $N_1$ and a second coupling node $N_2$. The second switch $S_2$ is coupled between the second coupling node $N_2$ and the GND. The first coupling node $N_1$ is coupled to the supply voltage circuit 32 to receive the second supply voltage $V_{SUPL}$. The second coupling node $N_2$ is coupled to the supply voltage circuit 32 via the third switch $S_3$. Accordingly, the second coupling node $N_2$ will receive the first supply voltage $V_{SUPH}$ when the third switch $S_3$ is closed. The auxiliary voltage circuit 28 also includes a decoupling capacitor $C_{DCP}$, which is provided between the first coupling node N1 and the GND.

In a first operation, the control circuit 36 may close the first switch $S_1$ and open the second switch $S_2$ and the third switch $S_3$. Accordingly, the auxiliary voltage circuit 28 will output the auxiliary voltage $V_{AUX}$ that equals the second supply voltage $V_{SUPL}$.

In a second operation, the control circuit 36 may close the third switch $S_3$ and open the first switch $S_1$ and the second switch $S_2$. Accordingly, the auxiliary voltage circuit 28 will output the auxiliary voltage $V_{AUX}$ that equals the first supply voltage $V_{SUPH}$.

In a third operation, the control circuit 36 may close the second switch $S_2$ and open the first switch $S_1$ and the third switch $S_3$. Accordingly, the auxiliary voltage circuit 28 will output the auxiliary voltage $V_{AUX}$ that equals 0 V.

Notably, the control circuit 36 may perform any of the first, second, and third operations when the bandwidth of the modulated voltage $V_{CC}$ is higher than or equal to the bandwidth threshold. In an embodiment, the control circuit 36 may also alternate between the first, second, and/or third operations based on a duty cycle to thereby output the auxiliary voltage $V_{AUX}$ in different values. Preferably, the auxiliary voltage circuit 28 will operate based on a significantly higher clock frequency than the MCP 24 (e.g., 20 times faster). As a result, the auxiliary voltage circuit 28 can change the auxiliary voltage $V_{AUX}$ much faster than the MCP 24 can change the low-frequency voltage $V_{DC}$.

In a fourth operation, the control circuit 36 may open the first switch $S_1$, the second switch $S_2$, and the third switch $S_3$. Accordingly, the auxiliary voltage circuit 28 will be decoupled from the auxiliary power inductor $L_{AUX}$. As a result, the auxiliary switcher circuit 22 will not provide the auxiliary current $I_{AUX}$ to the power amplifier circuit 12. Notably, the control circuit 36 will perform the fourth operation when the bandwidth of the modulated voltage $V_{CC}$ is lower than the bandwidth threshold.

Those skilled in the art will recognize improvements and modifications to the preferred embodiments of the present disclosure. All such improvements and modifications are considered within the scope of the concepts disclosed herein and the claims that follow.

What is claimed is:

1. A wide bandwidth power amplifier apparatus comprising:
   a power amplifier circuit configured to amplify a radio frequency (RF) signal based on a modulated voltage and a modulated current; and
   an envelope tracking (ET) integrated circuit (ETIC) comprising:
   a voltage circuit coupled to the power amplifier circuit and configured to generate the modulated voltage and a high-frequency current as part of the modulated current;
   a primary switcher circuit coupled to the power amplifier circuit and configured to generate a low-frequency current as part of the modulated current;

an auxiliary switcher circuit configured to generate an auxiliary current; and
a control circuit configured to:
cause the auxiliary switcher circuit to provide the auxiliary current to the power amplifier circuit as part of the modulated current when a bandwidth of the modulated voltage is higher than or equal to a bandwidth threshold; and
cause the auxiliary switcher circuit not to provide the auxiliary current to the power amplifier circuit when the bandwidth of the modulated voltage is lower than the bandwidth threshold.

2. The wide bandwidth power amplifier apparatus of claim 1, wherein:
the primary switcher circuit comprises:
a multi-level charge pump (MCP) configured to generate a low-frequency voltage as a function of a battery voltage; and
a primary power inductor configured to induce the low-frequency current based on the low-frequency voltage;
the voltage circuit comprises:
a voltage amplifier configured to generate the high-frequency current and an initial modulated voltage based on a supply voltage; and
an offset capacitor configured to raise the initial modulated voltage by an offset voltage to generate the modulated voltage; and
the auxiliary switcher circuit comprises:
an auxiliary voltage circuit configured to generate an auxiliary voltage as a function of an auxiliary input voltage; and
an auxiliary power inductor configured to induce the auxiliary current based on the auxiliary voltage.

3. The wide bandwidth power amplifier apparatus of claim 2, wherein the ETIC further comprises a supply voltage circuit configured to generate a first supply voltage and a second supply voltage lower than the first supply voltage.

4. The wide bandwidth power amplifier apparatus of claim 3, wherein the control circuit is further configured to:
cause the first supply voltage to be provided to the voltage amplifier as the supply voltage when the RF signal corresponds to a first peak-to-average ratio (PAR); and
cause the second supply voltage to be provided to the voltage amplifier as the supply voltage when the RF signal corresponds to a second PAR lower than the first PAR.

5. The wide bandwidth power amplifier apparatus of claim 4, wherein the control circuit is further configured to cause the second supply voltage to be provided to the auxiliary voltage circuit as the auxiliary input voltage independent of whether the RF signal corresponds to the first PAR or the second PAR.

6. The wide bandwidth power amplifier apparatus of claim 4, wherein the control circuit is further configured to:
cause the first supply voltage to be provided to the auxiliary voltage circuit as the auxiliary input voltage when the RF signal corresponds to the first PAR; and
cause the second supply voltage to be provided to the auxiliary voltage circuit as the auxiliary input voltage when the RF signal corresponds to the second PAR.

7. The wide bandwidth power amplifier apparatus of claim 6, wherein the control circuit is further configured to cause the supply voltage circuit to provide the first supply voltage to the voltage amplifier and the auxiliary switcher circuit concurrently when the RF signal corresponds to the first PAR.

8. The wide bandwidth power amplifier apparatus of claim 6, wherein the control circuit is further configured to cause the supply voltage circuit to provide the second supply voltage to the voltage amplifier and the auxiliary switcher circuit concurrently when the RF signal corresponds to the second PAR.

9. The wide bandwidth power amplifier apparatus of claim 1, wherein:
the voltage circuit is further configured to generate the modulated voltage and the high-frequency current based on a modulated target voltage; and
the control circuit is further configured to determine the bandwidth of the modulated voltage based on the modulated target voltage.

10. A wide bandwidth power amplifier apparatus comprising:
a power amplifier circuit configured to amplify a radio frequency (RF) signal based on a modulated voltage and a modulated current;
an envelope tracking (ET) integrated circuit (ETIC) comprising a primary switcher circuit coupled to the power amplifier circuit and configured to generate a low-frequency current as part of the modulated current; and
a distributed ETIC (DETIC) comprising:
a voltage circuit coupled to the power amplifier circuit and configured to generate the modulated voltage and a high-frequency current as part of the modulated current;
an auxiliary switcher circuit configured to generate an auxiliary current; and
a control circuit configured to:
cause the auxiliary switcher circuit to provide the auxiliary current to the power amplifier circuit as part of the modulated current when a bandwidth of the modulated voltage is higher than or equal to a bandwidth threshold; and
cause the auxiliary switcher circuit not to provide the auxiliary current to the power amplifier circuit when the bandwidth of the modulated voltage is lower than the bandwidth threshold.

11. The wide bandwidth power amplifier apparatus of claim 10, wherein the ETIC and the DETIC are provided in different dies.

12. The wide bandwidth power amplifier apparatus of claim 10, wherein:
the ETIC is coupled to the power amplifier circuit via a first coupling distance; and
the DETIC is coupled to the power amplifier circuit via a second coupling distance shorter than the first coupling distance.

13. The wide bandwidth power amplifier apparatus of claim 10, wherein:
the primary switcher circuit comprises:
a multi-level charge pump (MCP) configured to generate a low-frequency voltage as a function of a battery voltage; and
a primary power inductor configured to induce the low-frequency current based on the low-frequency voltage;
the voltage circuit comprises:
a voltage amplifier configured to generate the high-frequency current and an initial modulated voltage based on a supply voltage; and an offset capacitor configured to raise the initial modulated voltage by an offset voltage to generate the modulated voltage; and the auxiliary switcher circuit comprises:

an auxiliary voltage circuit configured to generate an auxiliary voltage as a function of an auxiliary input voltage; and an auxiliary power inductor configured to induce the auxiliary current based on the auxiliary voltage.

14. The wide bandwidth power amplifier apparatus of claim 13, wherein the DETIC further comprises a supply voltage circuit configured to generate a first supply voltage and a second supply voltage lower than the first supply voltage.

15. The wide bandwidth power amplifier apparatus of claim 14, wherein the control circuit is further configured to:

cause the first supply voltage to be provided to the voltage amplifier as the supply voltage when the RF signal corresponds to a first peak-to-average ratio (PAR); and cause the second supply voltage to be provided to the voltage amplifier as the supply voltage when the RF signal corresponds to a second PAR lower than the first PAR.

16. The wide bandwidth power amplifier apparatus of claim 15, wherein the control circuit is further configured to cause the second supply voltage to be provided to the auxiliary voltage circuit as the auxiliary input voltage independent of whether the RF signal corresponds to the first PAR or the second PAR.

17. The wide bandwidth power amplifier apparatus of claim 15, wherein the control circuit is further configured to:

cause the first supply voltage to be provided to the auxiliary voltage circuit as the auxiliary input voltage when the RF signal corresponds to the first PAR; and cause the second supply voltage to be provided to the auxiliary voltage circuit as the auxiliary input voltage when the RF signal corresponds to the second PAR.

18. The wide bandwidth power amplifier apparatus of claim 17, wherein the control circuit is further configured to cause the supply voltage circuit to provide the first supply voltage to the voltage amplifier and the auxiliary switcher circuit concurrently when the RF signal corresponds to the first PAR.

19. The wide bandwidth power amplifier apparatus of claim 17, wherein the control circuit is further configured to cause the supply voltage circuit to provide the second supply voltage to the voltage amplifier and the auxiliary switcher circuit concurrently when the RF signal corresponds to the second PAR.

20. The wide bandwidth power amplifier apparatus of claim 10, wherein:

the voltage circuit is further configured to generate the modulated voltage and the high-frequency current based on a modulated target voltage; and the control circuit is further configured to determine the bandwidth of the modulated voltage based on the modulated target voltage.

* * * * *